United States Patent [19]

Kermaani et al.

[11] Patent Number: 6,101,094

[45] Date of Patent: Aug. 8, 2000

[54] PRINTED CIRCUIT BOARD WITH INTEGRATED COOLING MECHANISM

[75] Inventors: Kaamel M. Kermaani, Cupertino; Raymond Kai Ho, San Jose, both of Calif.

[73] Assignee: Sun Microsystems, Inc., Palo Alto, Calif.

[21] Appl. No.: 09/216,136

[22] Filed: Dec. 18, 1998

[51] Int. Cl.[7] .................................................. H05K 7/20
[52] U.S. Cl. ........................ 361/720; 361/719; 361/721; 361/757; 361/784; 361/799; 257/706; 257/709; 257/713; 165/185; 174/16.3
[58] Field of Search ...................... 361/720, 722, 361/757, 784, 790, 796, 799, 683, 700–704, 709–712, 717–721, 735; 174/16.3, 52.4, 252, 52.2, 35 R; 257/706–726, 467, 696, 796; 29/830, 842; 165/80.2, 80.3, 80.4, 185; 439/69, 74, 485, 66

[56] References Cited

U.S. PATENT DOCUMENTS

| | | | |
|---|---|---|---|
| 3,157,828 | 11/1964 | Flaherty | 317/100 |
| 5,390,078 | 2/1995 | Taylor | 361/721 |

FOREIGN PATENT DOCUMENTS 406132687A   5/1994   Japan ................. H05K 7/20

Primary Examiner—Leo P. Picard
Assistant Examiner—Michael Datskovsky
Attorney, Agent, or Firm—Gunnison, McKay & Hodgson, LLP; Philip J. McKay

[57] ABSTRACT

An electronic device having two or more printed circuit boards with integrated heat-dissipating mechanism without a fan. A heat-generating circuit component is placed on a daughter board separated from a motherboard. An electrically insulating thermal conductor is placed between the daughter board and the motherboard for heat transfer.

13 Claims, 3 Drawing Sheets

PRINTED CIRCUIT BOARD WITH INTEGRATED COOLING MECHANISM

FIELD OF THE INVENTION

The present invention relates to heat dissipation and cooling in electronic devices, and more specifically, to printed circuit boards with an integrated cooling mechanism.

BACKGROUND

Many electronic components can function properly when the operating temperature is within a specified temperature range. In particular, it is desirable to keep the operating temperature of these electronic components below a maximum temperature limit. The excessive thermal energy associated with the temperature above the maximum limit may degrade the performance and lifetime, and cause malfunction or even permanently damage in these components. Unfortunately, most electronic components internally generate heat by converting electrical energy into thermal energy due to the inherent electrical resistance. Therefore, it is often necessary to implement some cooling mechanism to properly dissipate the heat in electronic circuits and devices.

Heat dissipation is particularly important in devices such as computers that have high-density electronic components formed one or more integrated circuit boards. Heat sinks and fans have been widely used as cooling devices in many circuit board designs. A heat sink is usually attached to a heat-generating component such as a microprocessor chip to remove the heat and then the heat is further dissipated away from the circuit board by forced air circulation by using a fan.

FIG. 1 illustrates an example of a conventional printed circuit board with a heat sink and a fan formed over a heat-generating integrated circuit on a motherboard. The heat-generating integrated circuit and other components are formed on the same motherboard.

However, heat sinks and fans are usually bulky and increase the dimension (e.g., height) of a circuit board. This limits the applications of heat sinks and fans, especially in compact devices such as portable computers and rack-mounted systems that have multiple circuit boards stack together. Many cooling fans such as miniature fans commonly installed in personal computers are prone to failure due to their typical operating conditions such as elevated temperatures, pressure drop across the fan, and adverse effects of the particles in the ambient air.

Other alternative cooling techniques have been used in integrate circuit devices, including heat pipes, thermoelectric coolers, and liquid cooling. But these techniques are also limited due to cost, complexity, reliability and cooling efficiency.

The present disclosure provides techniques and electronic devices to cool printed circuit boards without conventional heat sinks and fans. At least two circuit boards are used to separate one or more heat-generating circuit elements from other circuit elements. An electrically-insulating thermal conductor is used to dissipate the heat in the ambient air outside the circuit boards and prevents the heat from dissipating into the air near the circuit components.

One embodiment of such an electronic device includes a first printed circuit board having a ground conducting layer that is connected to a metal chassis and a circuit surface configured to support circuit elements, and a second printed circuit board electrically connected to the first printed circuit board and having a circuit surface that supports a heat-generating circuit element. The heat-generating circuit element generates more heat than any of the circuit elements on the first printed circuit board. The second printed circuit board is disposed relative to the first printed circuit board in such a way that said circuit surface of the second printed circuit board opposes the circuit surface of the first printed board.

An electrically insulating thermal conductor medium is formed between the first and second circuit boards. One side of the thermal conductor medium is in direct contact with the heat-generating circuit element and another side of the thermal conductor medium is in thermal contact with the ground conducting layer in the first circuit board so that the heat from the heat-generating circuit element can be at least partially dissipated to the metal chassis.

The thermal contact between the thermal conductor medium and the ground conducting layer is formed by an electrically conducting layer disposed on the circuit side of the first printed circuit board. A plurality of electrical conductors disposed to connect the conducting layer in order to transfer thermal energy from the thermal conductor medium to the ground layer.

An output panel of the first circuit board may also be in thermal contact with the thermal conductor medium to further dissipate the heat into the ambient air.

One advantage of the above device is that fans and conventional heat sinks are eliminated so that the device can be made more compact and reliable.

These and other aspects and associated advantages of the present invention will become more apparent in light of the following detailed description, the accompanying drawings, and the claims.

DETAILED DESCRIPTION OF THE PREFERRED EMBODIMENTS

Figure 1:
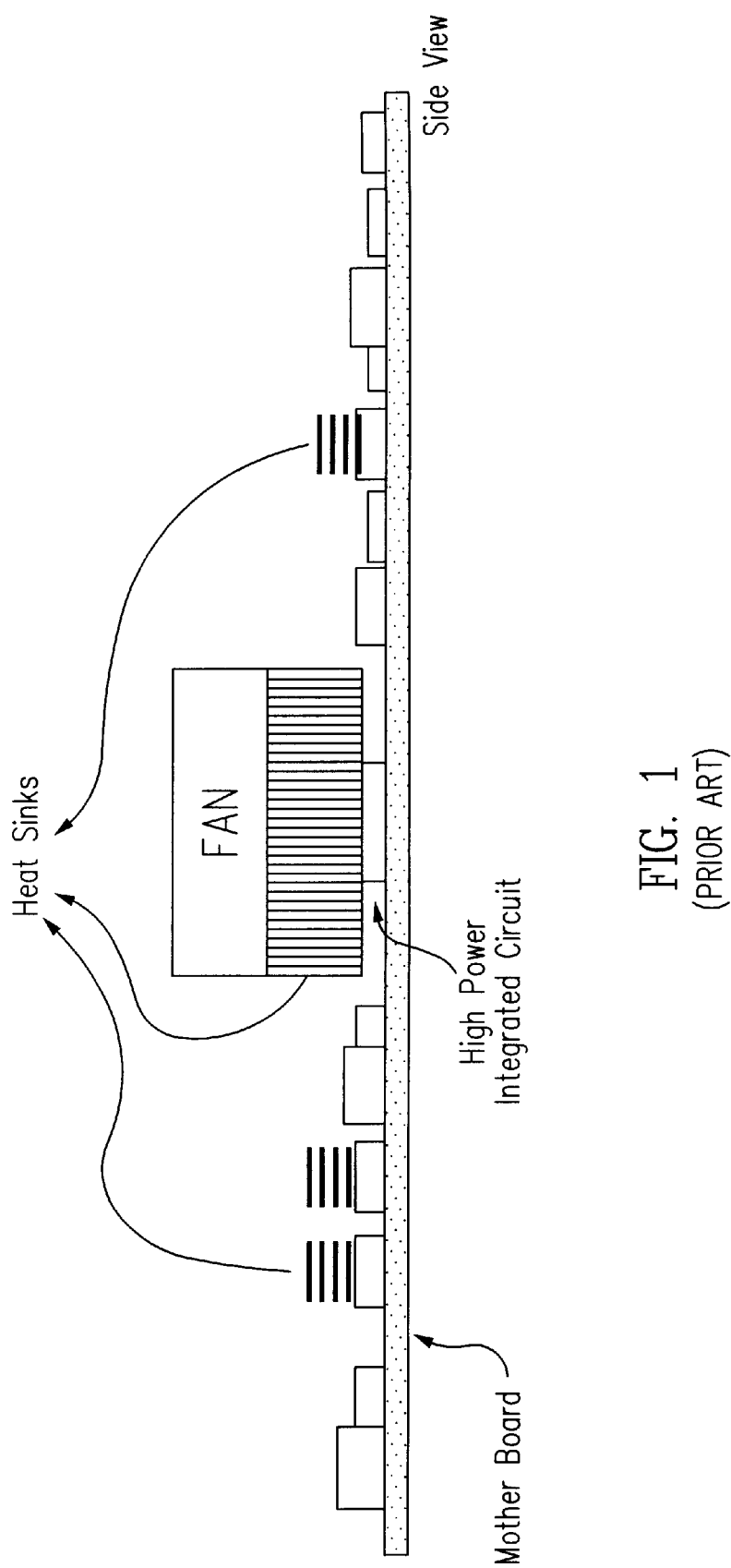
FIG. 1 illustrates an example of a conventional printed circuit board with a heat sink and a fan.
Figure 2:
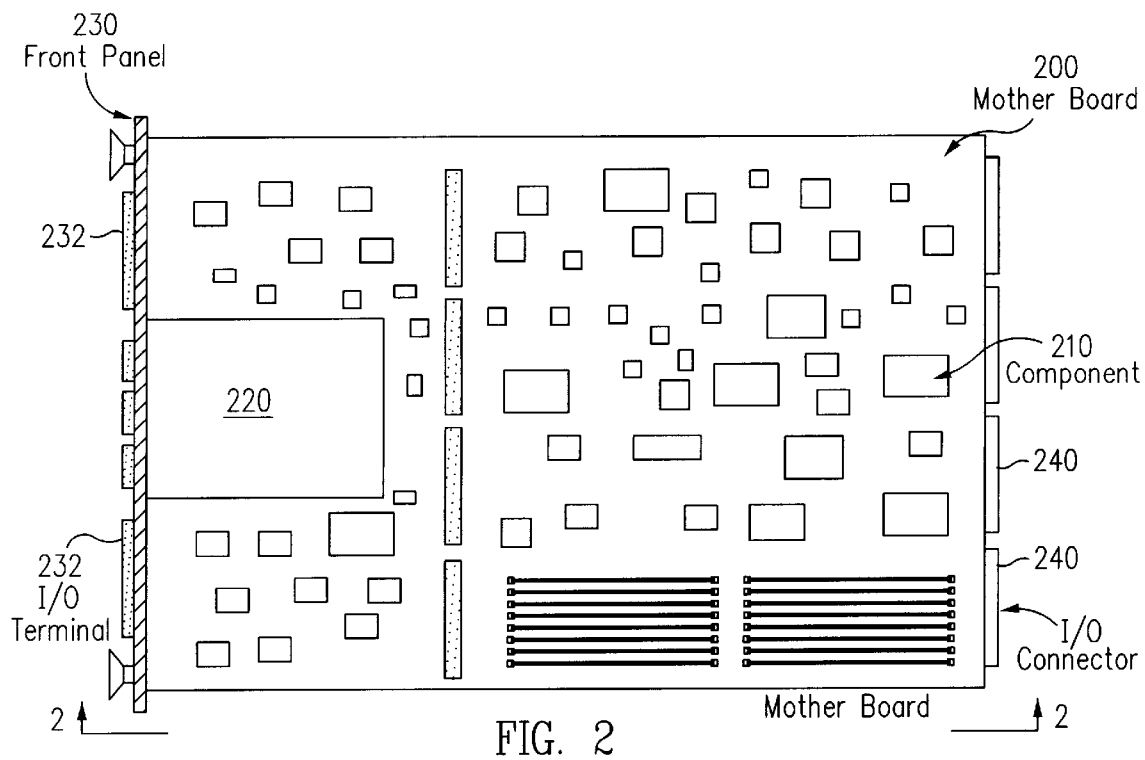
FIG. 2 is a diagram illustrating one embodiment of a printed integrated circuit board which has a separate circuit board for holding heat-generating components.
Figure 3:
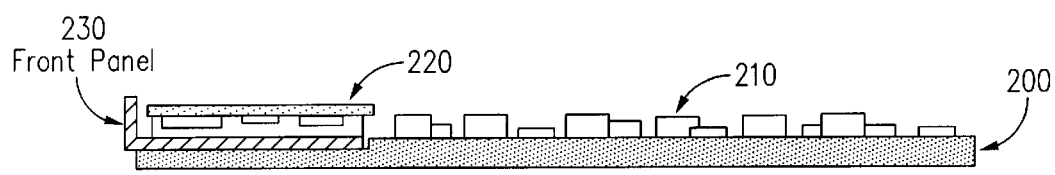
FIG. 3 is a side view of the circuit board shown in FIG. 2 along the line 2—2.
Figure 4:
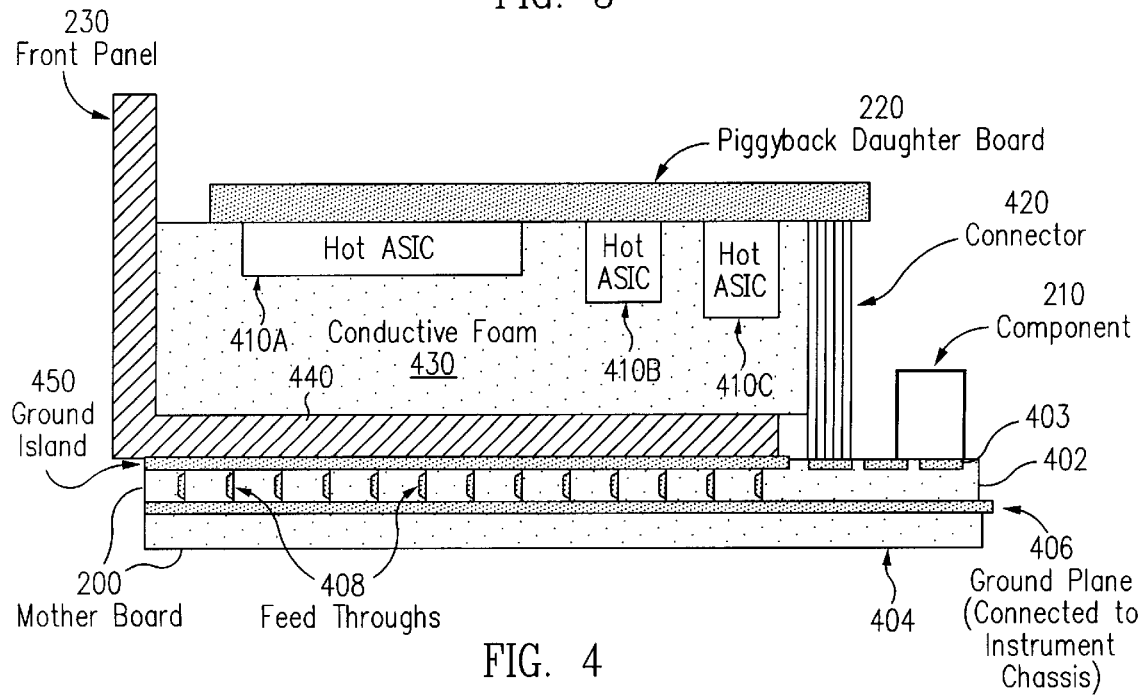
FIG. 4 is a side view of the separate circuit board with heat-generating components, a thermal conductive medium, and a heat dissipating plate formed over the motherboard.

A preferred embodiment of a printed integrated circuit board with a cooling mechanism is shown in FIGS. 2, 3, and 4. FIGS. 2 and 3 respectively show a top view and a side view of the integrated circuit board.

The integrated circuit board includes a motherboard 200 on which a plurality of electronic components are mounted. The electronic components on the motherboard 200 are divided into "hot" components which generate the most heat in the circuit board and "regular" components that generate less heat than a hot component. Whether a component is a hot component or a regular component is determined by the heat generation capacity of all the components and cooling requirements of a specific circuit board. In a typical computer, for example, the microprocessor chip external static random-access-memory ("SRAM") devices may be considered as the hot components while other components may be the regular components. A component may be treated as a hot component in one application but as a regular component in another application.

The hot components and the regular components are preferably mounted differently onto the motherboard 200. The regular components, 210, are mounted directly onto the motherboard 200 as in the conventional circuit boards. The hot components, however, are grouped together and mounted on a separate daughter board 220. The daughter board 220 is then connected to the motherboard 200. A special area on the motherboard 200 is designated to mount the daughter board 220 and to connect the hot components to the rest of the circuit. The circuit communicates with other devices and circuit boards through input and output terminals 232 of an input/output ("I/O") panel 230 and edge connectors 240. Preferably, the daughter board 220 is located in an area adjacent to an edge of the motherboard 200 where the I/O panel 230 is placed.

FIG. 4 shows hot components 410A, 410B, 410C mounted to the daughter board 220 and electrically connected to the circuitry on the motherboard 200 by a connector 420. The circuit side of the daughter board 220 faces the circuit side of the motherboard 200.

The motherboard 200 in general includes a plurality of different conductive layers of certain conductor patterns which alternate with insulating layers. The conductive layers may include a ground layer which is usually connected to the chassis, a voltage layer that provides voltage signals to different parts of the circuitry, a signal layer that routes signals. The number of conductive layers can be two or more depending on the requirements of an application.

For example, a printed circuit board of six layers may include a ground layer, one voltage layer, and four different signal layers. For simplicity, four layers of the motherboard 200 are illustrated in FIG. 4, including two insulating layers 402 and 404, a ground conducting layer 406 (e.g., copper) sandwiched therebetween, and a conductive layer 403 formed over the insulating layer 402.

The surface of the insulating layer 402 forms a circuit side in which the conductive layer 403 has printed conducting paths that connect the regular components 210, the connector 420 to the daughter board 220, and the I/O panel 230, and the edge connectors. A layer of conductor (e.g., copper) is deposited on the designated area over the insulating layer 402 for mounting the daughter board 220 to form a ground island 450. The conductive layer 403 is separated from the ground island 450 on the surface of insulating layer 402.

Multiple feedthrough holes 408 are formed within the designated area in the insulating layer 402 so that conducting wires can be installed to electrically connect the ground island 450 to the ground conducting layer 406 at different locations. Multiple conducting wires are used here to increase the total contacting area between the ground conducting layer 406 and the ground island 450. Since the conducting wires are also thermal conductors, the increased total contacting area increases the heat dissipation from the ground island 450 to the ground conducting layer 406.

The I/O panel 230 is specially designed to have an extended flat portion, a heat transfer member 440. The heat transfer member 440 may be substantially perpendicular to the I/O panel 230 in many applications. The I/O panel and the heat transfer member 440 are preferably formed of a thermal conductor, including metals such as aluminum or aluminum alloys. When a metal (e.g., aluminum) is used, the I/O panel 230 and the heat transfer member 440 may be formed from a single piece of metal or welded together. As will be described, the heat transfer member 440 operates to transfer a portion of the internally generated heat from the circuit to the I/O panel 230. The I/O panel 230, usually having a large surface area, dissipates the heat into the ambient air.

A thermal interface medium 430 fill the space between the daughter board 220 and the heat transfer member 440 so that the heat generated by the hot components 410A, 410B, and 410C can be transferred to the heat transfer member 440 by the thermal interface medium 430. The thermal interface medium 430 is preferably an electrically insulating material of a high thermal conductivity and substantially covers the entire circuit side of the daughter board 220 to form a thermal contact with each hot component. Some commercial thermal conducting materials such as Elastomeric Pads, Thermal Compounds, Wax on Carrier Film, can be used as the thermal interface medium 430. The thermal interface medium 430 may be a molded foam having one surface that conforms the contour of the hot components on the daughter board 220 to achieve an efficient thermal contact. The daughter board 220 can be pressed against the thermal interface medium 430 by, e.g., screwing down to the motherboard 200 to improve the thermal contact.

The heat from the hot components 410A, 410B, and 410C on the daughter board 220 is conducted to the heat transfer member 440 through the thermal interface medium 430. The heat is then dissipated out of the motherboard 200 in two different channels. The first dissipation channel is the front panel 230 which functions as a heat-dissipating element as described earlier. The second dissipation channel is the ground conducting layer 406 where the ground island 450 extracts a portion of the heat from the heat transfer member 440 and transfers the heat to the ground conducting layer 406 through the feedthrough holes 408. The ground conducting layer 406 is usually connected to a metal chassis (e.g., aluminum). The metal chassis typically has a large surface area and therefore can quickly dissipate the heat into the ambient air.

Certain circuit boards may not have an I/O panel 230 but communicate with other circuit boards or devices through the edge connectors 240 or other connectors on the circuit board. One example of such a circuit board is a motherboard that holds a main microprocessor in many personal computers. A different circuit board design can be used to implement the above two-channel heat dissipation mechanism.

Figure 5:
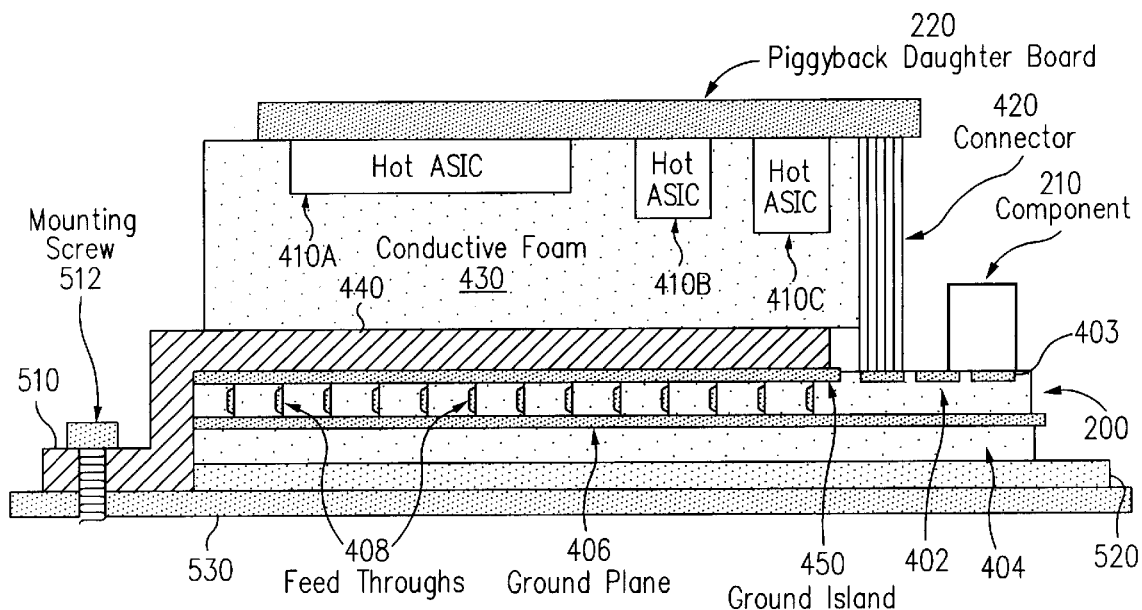
FIG. 5 is a diagram illustrating another embodiment of a printed integrated circuit board which has a separate circuit board for holding heat-generating components.
Figure 6:
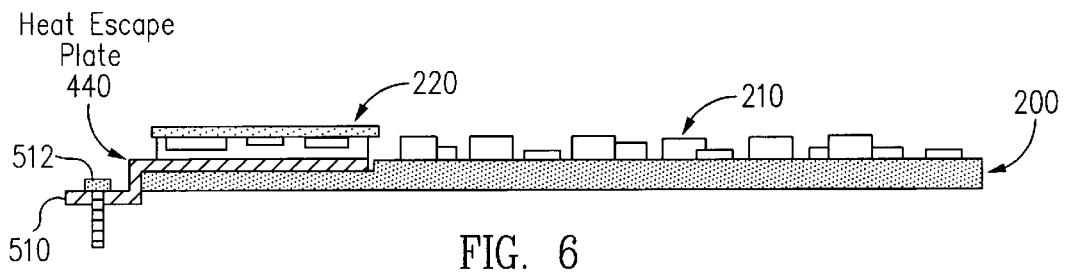
FIGS. 6 and 7 are a side view and a top view of the circuit board shown in FIG. 5.
Figure 7:
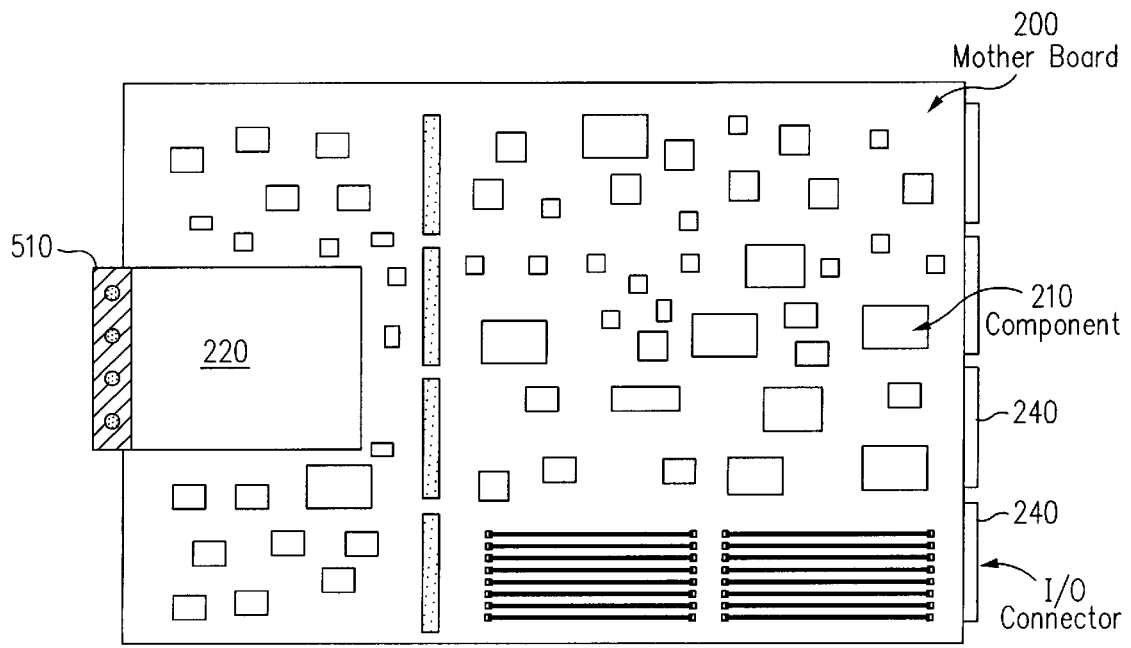

FIGS. 5, 6, and 7 show one embodiment. The motherboard 200 is mounted to the metal chassis 530. An electrical insulating layer 520 is placed between the motherboard 200 and the metal chassis 530. A heat transfer mounting member 510 is used to replace the I/O panel 230 in FIG. 4. The heat transfer mounting member 510 is integrated to the heat transfer member 440 and is directly engaged to the metal chassis 530 to form a thermal contact by, for example, one or more screws 512. This thermal contact allows the heat transfer mounting member 510 to transfer a portion of the heat from the heat transfer member 440 to the chassis. When metal is used, the members 510 and 440 may be formed from a single piece of metal or welded to each other.

Hence, the first heat dissipation channel through the I/O panel 230 in FIG. 4 is replaced by heat dissipation by transferring a portion of the heat to the metal chassis 530 through the heat transfer mounting member 510.

The above printed circuit boards separate the heat-generating hot components and other components on different boards and use an electrically insulating thermal interface medium to eliminate the conventional heat sinks and fans. Such printed circuit boards can be made very compact for high-density circuit applications. For example, the height of the circuit board can be less than 0.6 inch and can be advantageously used to form compact circuit board stacks rack mounted systems or desktop systems. The thermal interface medium placed between the daughter board and the motherboard not only conducts the heat from the heat-generating components to the ground island of the motherboard but also substantially confines the heat within the thermal interface medium so that most of the heat will not dissipate into the space surrounding the circuit components but instead dissipate into the ambient air outside the circuit. This aspect of the invention is advantageous over conventional heat sinks which dissipate heat into the air surrounding the circuit components.

Although only one daughter board is described in the above embodiment, two or more such daughter boards with heat-generating components can be implemented. Various other modifications and enhancements may be made, which are intended to be encompassed by the appended claims.

What is claimed is:

1. An electronic device capable of passively dissipating heat, comprising:

a plurality of first circuit components;

a first circuit board, said first circuit board having a first surface and a second surface, opposite said first surface;

a second circuit board, said second circuit board having a first surface including a thermally conductive layer formed on a first area of said first surface, said second circuit board having a second surface, opposite said first surface, said second circuit board being separated from said first circuit board such that said second circuit board first surface is opposite said first circuit board second surface, said second circuit board configured to hold said plurality of first circuit components, wherein said second circuit board is electrically connected to said first circuit board so that said plurality of first circuit components are electrically connected to said first circuit board;

at least one heat-generating circuit component that generates more heat in operation than any of said plurality of first circuit components, said at least one heat-generating circuit component having a top surface and a bottom surface, opposite said top surface, said at least one heat-generating circuit component bottom surface being attached to a portion of said first circuit board second surface such that said at least one heat-generating circuit component top surface is opposite said thermally conductive layer formed on said second circuit board first surface and such that said at least one heat-generating circuit component top surface is separated from said thermally conductive layer formed on said second circuit board first surface;

an electrically-insulating thermal conductor interposed between said at least one heat-generating circuit component top surface and said thermally conductive layer formed on said second circuit board first surface to contact said at least one heat-generating circuit component top surface to transfer at least a portion of heat generated by said at least one heat-generating circuit component to said thermally conductive layer formed on said second circuit board first surface so as to dissipate said portion of heat.

2. The device as in claim 1, further comprising a heat-dissipating element having a thermal conducting area exposed to ambient air and in contact with said electrically-insulating thermal conductor to extract another portion of heat generated by said heat-generating circuit component and to dissipate said another portion of heat into ambient air.

3. The device as in claim 1, further comprising a metal chassis having an area exposed to ambient air, wherein said metal chassis is in contact with said thermally conductive layer formed on said first surface of said second circuit board so as to dissipate said portion of heat into ambient air.

4. The device as in claim 3, further comprising a metal member engaged to both said electrically-insulating thermal conductor and said metal chassis to transfer another portion of heat to said metal chassis for dissipation into ambient air.

5. An electronic device having an integrated heat dissipation mechanism, comprising:

a second circuit board formed of a plurality of electrically conducting layers and insulating layers, wherein said conducting layers include a ground layer;

said second circuit board having a first surface configured to support a first set of circuit elements disposed in a first area on said second circuit board first surface and a thermally conductive layer formed on a second area of said first surface;

said thermally conductive layer formed on said second area of said first surface being connected to said ground layer by a plurality of electrical conductors that are insulated from other conducting layers in said second circuit board;

a heat transfer member disposed adjacent said thermally conductive layer, to form a thermal contact which allows exchange of thermal energy between said heat transfer member and said thermally conductive layer;

a first circuit board having a second surface that supports at least one heat-generating circuit component, said at least one heat-generating circuit component having a top surface and a bottom surface, opposite said top surface, said at least one heat-generating circuit component bottom surface being attached to a portion of said first circuit board second surface such that said at least one heat-generating circuit component top surface is opposite said thermally conductive layer formed on said second circuit board first surface and such that said at least one heat-generating circuit component top surface is separated from said thermally conductive layer formed on said second circuit board first surface;

an electrically-insulating thermal conductor interposed between said at least one heat-generating circuit component top surface and said thermally conductive layer formed on said second circuit board first surface to contact said at least one heat-generating circuit component top surface to transfer at least a portion of the heat generated by said at least one heat-generating circuit component to said heat transfer member so as to dissipate said portion of heat; and an interconnect circuit connecting said second circuit board to said first circuit board, wherein, said electrically-insulating thermal conductor transfers heat generated by said at least one heat-generating circuit component to said heat transfer member and said ground layer in said second circuit board dissipates at least a portion of said heat into the ambient air.

6. The device as in claim 5, wherein said heat transfer member includes a metal.

7. The device as in claim 5, further comprising a heat-dissipating element in thermal contact with said heat transfer member and exposed to ambient air, wherein said heat transfer member transfers a portion of heat from said electrically-insulating thermal conductor to said heat-dissipating element, thereby dissipating said portion of heat into ambient air.

8. An electronic device having a passive integrated heat dissipation mechanism, comprising:

a metal chassis exposed to ambient air;

a second circuit board having a ground layer that is connected to said metal chassis and having a first surface configured to support a first set of circuit elements;

a thermally conductive layer disposed on said second circuit board first surface and separated from said first set of circuit elements;

a plurality of electrical conductors disposed to connect said thermally conductive layer to said ground layer formed in said second circuit board and to transfer thermal energy from said thermally conductive layer to said ground layer;

a heat transfer member disposed adjacent said thermally conductive layer to dissipate thermal energy to said thermally conductive layer;

a first circuit board, electrically connected to said second circuit board, and having a second surface that supports at least one heat-generating circuit component which generates more heat than said circuit elements on said second circuit board, said at least one heat-generating circuit component having a top surface and a bottom surface, opposite said top surface, said at least one heat-generating circuit component bottom surface being attached to a portion of said first circuit board second surface such that said at least one heat-generating circuit component top surface is opposite said thermally conductive layer formed on said second circuit board first surface and such that said at least one heat-generating circuit component top surface is separated from said thermally conductive layer formed on said second circuit board first surface;

an electrically-insulating thermal conductor interposed between said at least one heat-generating circuit component top surface and said thermally conductive layer formed on said second circuit board first surface to contact said at least one heat-generating circuit component top surface to transfer at least a portion of the heat generated by said at least one heat-generating circuit component to said heat transfer member so as to dissipate said portion of heat;

wherein said electrically-insulating thermal conductor transfers heat from said heat-generating circuit component to said heat transfer element and said thermally conductive layer, and said ground layer in said second circuit board dissipates a portion of said heat into ambient air through said metal chassis.

9. The device as in claim 8, wherein said heat-generating circuit element includes a microprocessor.

10. The device as in claim 9, wherein said electrically-insulating thermal conductor includes a thermal conducting foam.

11. The device as in claim 8, further comprising a heat transfer mounting element engaged to both said heat transfer element and said metal chassis and operating to transfer another portion of said heat to said metal chassis for dissipation into ambient air.

12. The device as in claim 8, further comprising a metal input and output panel exposed to the ambient air and engaged to said heat transfer element to form a thermal contact, said panel operating to extract another portion of said heat from said heat transfer element and to dissipate said another portion of said heat into ambient air.

13. A method for configuring an electronic device having a plurality of circuit components to efficiently dissipate heat, comprising:

selecting at least one heat-generating circuit component which generates more heat than the other circuit components from said plurality of circuit components, said at least one heat-generating circuit component having a top surface and a bottom surface, opposite said top surface;

attaching said heat-generating circuit component bottom surface to a second surface of a first circuit board, said first circuit board having a first surface, opposite said second surface;

placing other circuit components on a first area of a first surface of a second circuit board and forming a thermally conductive layer on a second area of said first surface of said second circuit board, said second circuit board having a second surface, opposite said first surface, said second circuit board being separated from said first circuit board such that said second circuit board first surface is opposite said first circuit board second surface;

implementing an electrically insulating thermal conductor between said at least one heat-generating circuit component top surface and said thermally conductive layer formed on said second area of said second circuit board first surface to contact said at least one heat-generating circuit component top surface to transfer at least a portion of the heat generated by said at least one heat-generating circuit component to said thermally conductive layer to transfer a portion of heat generated by said heat-generating circuit component to a ground layer formed in said second circuit board; and dissipating said portion of heat into ambient air.

* * * * *